(12) United States Patent
Seeger et al.

(10) Patent No.: US 8,183,944 B2
(45) Date of Patent: May 22, 2012

(54) METHOD AND SYSTEM FOR USING A MEMS STRUCTURE AS A TIMING SOURCE

(75) Inventors: Joseph Seeger, Menlo Park, CA (US);
Goksen G. Yaralioglu, Mountain View, CA (US); Baris Cagdaser, Sunnyvale, CA (US)

(73) Assignee: Invensense, Inc., Sunnyvale, CA (US)

( * ) Notice: Subject to any disclaimer, the term of this patent is extended or adjusted under 35 U.S.C. 154(b) by 115 days.

(21) Appl. No.: 12/418,547

(22) Filed: Apr. 3, 2009

(65) Prior Publication Data

US 2010/0253437 A1 Oct. 7, 2010

(51) Int. Cl.
*H03B 5/30* (2006.01)
(52) U.S. Cl. ... 331/154; 331/116 M; 331/34; 331/177 R
(58) Field of Classification Search .................. 331/154, 331/116 M, 34, 177 R
See application file for complete search history.

(56) References Cited

U.S. PATENT DOCUMENTS

| | | | |
|---|---|---|---|
| 7,157,984 B2 | 1/2007 | McCorquodale et al. | |
| 7,202,761 B2 | 4/2007 | Lutz et al. | |
| 7,224,236 B2 | 5/2007 | Partridge et al. | |
| 7,250,892 B2 * | 7/2007 | Weinstein et al. | 341/155 |
| 7,271,383 B2 | 9/2007 | Chee | |
| 7,310,174 B2 * | 12/2007 | Wine et al. | 359/201.1 |
| 7,362,197 B2 | 4/2008 | Lutz et al. | |
| 7,427,905 B2 | 9/2008 | Lutz et al. | |
| 7,453,324 B2 | 11/2008 | Partridge et al. | |
| 7,482,887 B2 | 1/2009 | Cyr et al. | |
| 7,532,081 B2 * | 5/2009 | Partridge et al. | 331/154 |
| 2006/0212097 A1 | 9/2006 | Varadan et al. | |

* cited by examiner

*Primary Examiner* — Arnold Kinkead
(74) *Attorney, Agent, or Firm* — Sawyer Law Group, P.C.

(57) ABSTRACT

A system and method is disclosed that provides a technique for generating an accurate time base for MEMS sensors and actuators which has a vibrating MEMS structure. The accurate clock is generated from the MEMS oscillations and converted to the usable range by means of a frequency translation circuit.

9 Claims, 9 Drawing Sheets

METHOD AND SYSTEM FOR USING A MEMS STRUCTURE AS A TIMING SOURCE

FIELD OF THE INVENTION

The present invention relates generally to MEMS devices and more specifically to MEMS devices with a vibrating MEMS structure, wherein the primary function of the MEMS structure is not to provide an accurate clock.

BACKGROUND OF THE INVENTION

MEMS devices with integrated IC electronics are being used in many consumer applications. For example, MEMS accelerometers are used in air bag deployment, MEMS gyros provide hand jitter information for image stabilization in digital cameras, MEMS microphones are replacing conventional electret microphones in cell phones, vibrating mirrors enable ultra small projectors for consumer applications. In the earlier MEMS devices, the sensor output was usually provided to the outside world by analog signals. In recent years, consumer applications started to require additional features from the MEMS devices. These additional features include providing digital outputs, digital filtering, and interrupt generation upon detecting certain ranges of sensor data. Even further, many inertial sensors include algorithms or features for detection of complex movements and gestures. These additional features are implemented using digital circuits and the accuracy of these circuits is determined by the accuracy of the clock signal. Especially, for navigation applications, accuracy of the timing is crucial. Applications such as GPS assist and dead reckoning rely on integration of motion sensor output to determine orientation and position. The accuracy of the integration time steps is determined by the accuracy of the clock.

Figure 1:
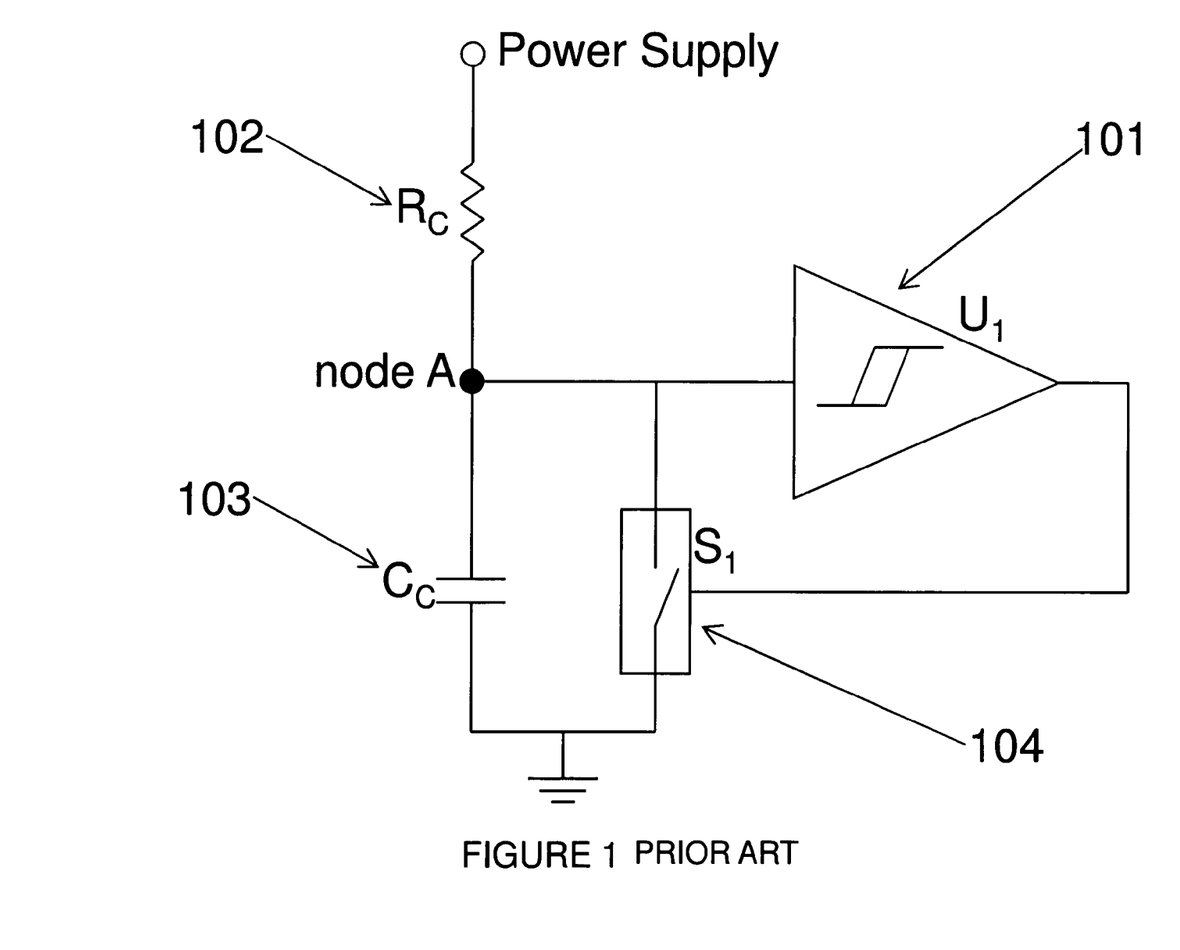
FIG. 1 is a diagram of a relaxation oscillator.

There are two common types of oscillator circuits: relaxation oscillators and harmonic oscillators. In relaxation oscillators, an energy storing device (capacitor or inductor) is charged and discharged by a non-linear circuit component. This cycle is repeated indefinitely creating a periodic signal which is usually a saw tooth wave. FIG. 1 shows an example of a relaxation oscillator circuit. In this circuit, the capacitor $C_C$ (103) is charged through the resistor $R_C$ (102). The voltage at node A increases as the capacitor charge increases. The Schmitt trigger 101 output stays low if the input is below certain threshold value, LH, or goes to high if the input exceeds another threshold value, HI. The capacitor voltage or the voltage at node A in this circuit controls the output of the buffer. When the voltage exceeds the high threshold voltage of the Schmitt trigger buffer 101, the buffer output becomes logic high closing the switch 104. The capacitor is discharged through the switch 104. When the capacitor voltage drops below the low threshold, Schmitt trigger buffer 101 output goes back to logic low opening the switch 104. At this point, the resistor starts charging the capacitor again. This cycle repeats continuously creating a square wave at the buffer output. The oscillation frequency of the circuit is determined by the $R_C C_C$ time constant. Small changes in the R or C values directly affect the oscillation frequency.

Figure 2:
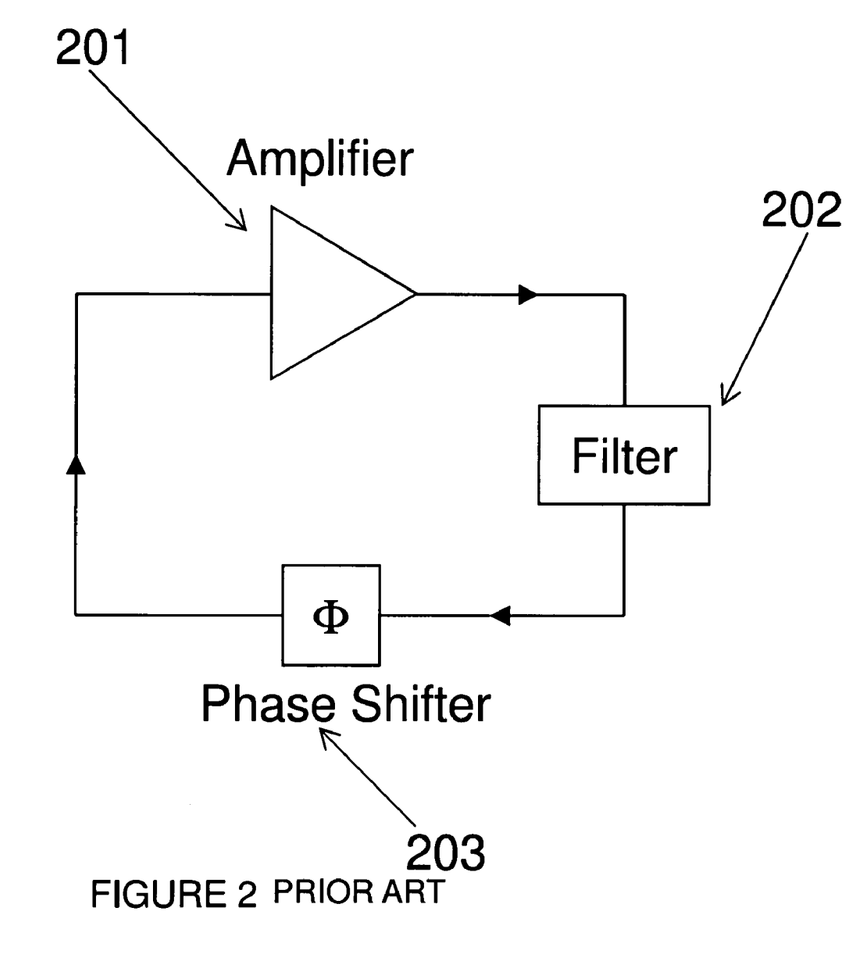
FIG. 2 is a diagram of a harmonic oscillator.

Harmonic oscillators on the other hand generate a sinusoidal signal. FIG. 2 shows such a circuit. The output of an amplifier 201 is fed to the input of the amplifier through a filter 202 as shown in FIG. 2. The phase shifter 203 ensures that the oscillations are sustained by adjusting the overall loop phase to zero. The quality factor of the filter limits the stability of the frequency and the phase noise of the oscillator. For increased accuracy, mechanical elements such as quartz crystals or MEMS structures with high Q are used as the frequency determining elements.

In many integrated MEMS devices, the clock signal is usually generated by a relaxation oscillator due to its simplicity, small area requirement and low power consumption. However, the frequency of this circuit is a function of the resistive and capacitive circuit components which may change with process parameters or temperature. For example, typically the resistor values change 10% over 100 degree C., resulting 10% frequency shift over the specified temperature range. On the other hand, a crystal filter provides a very accurate clock signal but using these filters is prohibited by the cost and size requirements of the consumer applications.

There is a need for generating an accurate timing base in MEMS devices without using an external quartz crystal or another source. The present invention addresses such a need.

SUMMARY OF THE INVENTION

A method of providing an accurate clock source for electronics that support a MEMS device which has a vibrating MEMS structure is described. The accurate clock is obtained from the oscillating MEMS itself with minimal additional cost. The MEMS oscillation frequency is used as the reference signal for a frequency translator circuit such as PLL, DLL or frequency multiplier which generates the timing source for the supporting electronics.

DETAILED DESCRIPTION

The present invention relates generally to MEMS devices and more specifically to MEMS devices with a vibrating MEMS element. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

Figure 3:
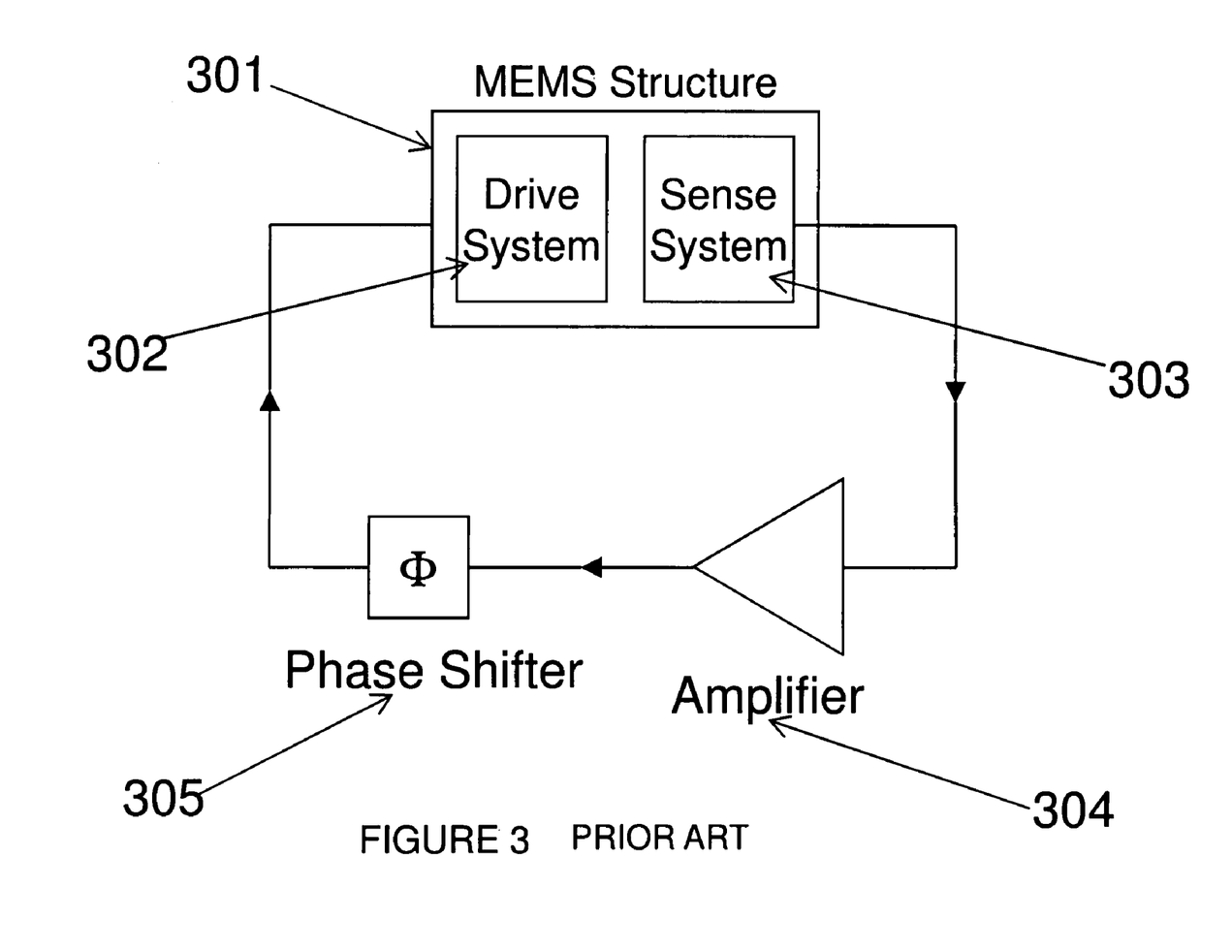
FIG. 3 is a diagram of an oscillating MEMS device.

A variety of MEMS devices uses vibrating micromechanical structures. Vibratory MEMS gyroscopes, resonant accelerometers and scanning MEMS mirrors are some examples of such devices. The resonant structure in these devices provides a high Q as well as the oscillation frequency is very stable over temperature. In general, a MEMS structure 301 is placed into oscillatory state as shown in FIG. 3. In the most general form, the MEMS structure 301 has a sense system 303 and a drive system 302. The motion of the micromechanical structure is detected by the sense system 303. The sense system 303 can be capacitive, piezoresistive, piezoelectric or optical. The output of the sense system 303 is converted into electrical signals by a circuit and amplified by an amplifier 304. The phase of the amplified signal is adjusted by the phase shifter 305 appropriately at the oscillating frequency. The overall loop phase should be zero to satisfy oscillation condition such that oscillations build up. Another condition that needs to be satisfied for oscillation is that the overall loop gain should be equal to or larger than 1. The drive system 302 moves the MEMS structure proportional to the applied signal. The drive system 302 can be capacitive, piezoelectric, thermal or another actuation method that is common to MEMS systems. When the position signal is applied to the drive system with proper gain and phase as explained above, the MEMS system starts to vibrate at its resonant frequency.

Figure 4:
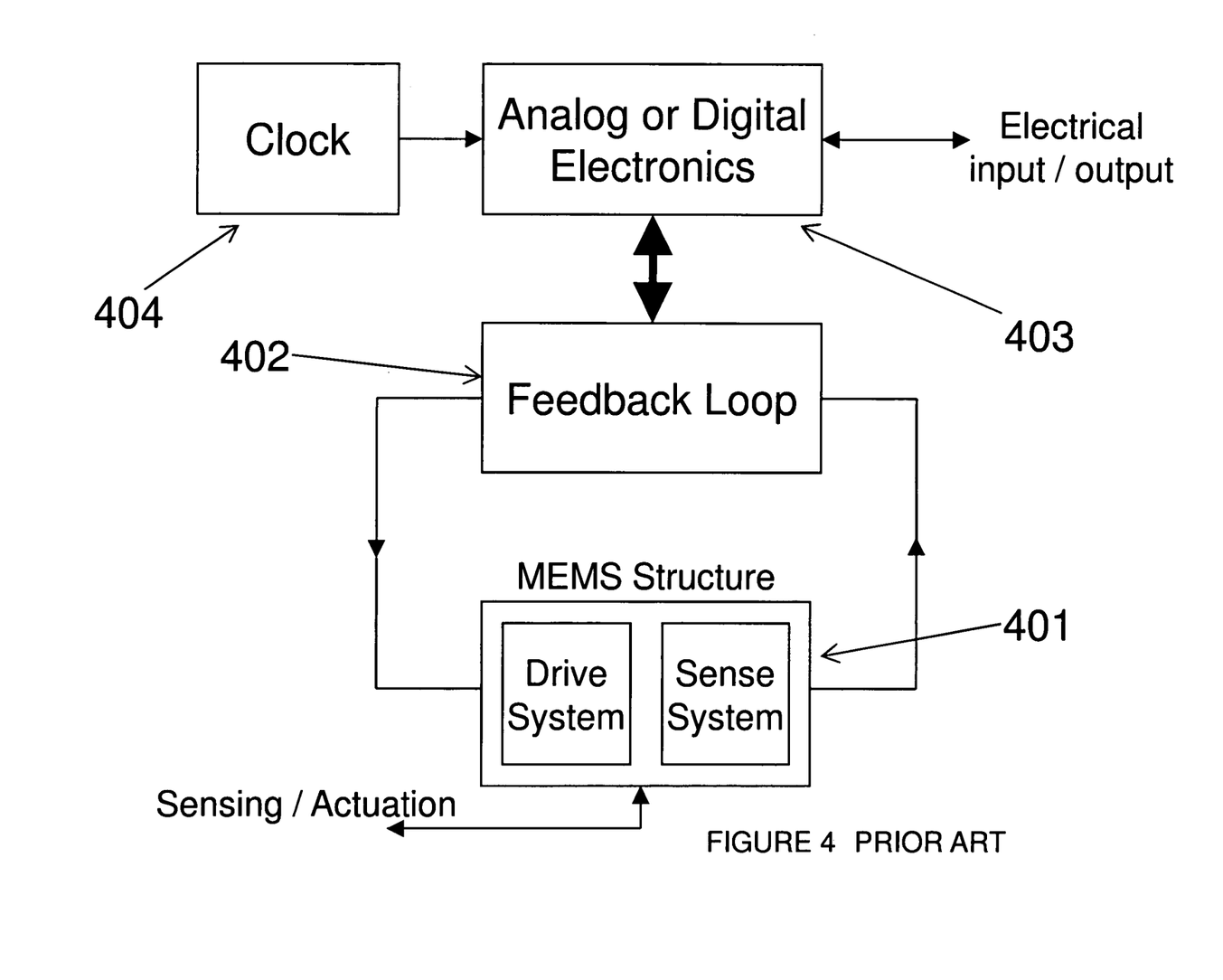
FIG. 4 is a diagram of an oscillating MEMS device where the clock to the digital support electronics is provided by an oscillator circuit that uses circuit elements.

FIG. 4 shows a typical MEMS device with a resonating micromechanical structure. In this device micromechanical structure 401 is oscillating by the feedback loop that is part of the analog electronics 402. The clock for the digital electronics 403 is provided by another oscillator circuit 404 that is composed of electrical components. As an example this MEMS device can be a vibratory gyroscope. In this case, the sensor senses the Coriolis input and converts it to an electrical signal. The MEMS device can also be an actuator as in the case of scanning mirrors. Scanning mirrors scan an optical beam reflecting off their surface.

Figure 5:
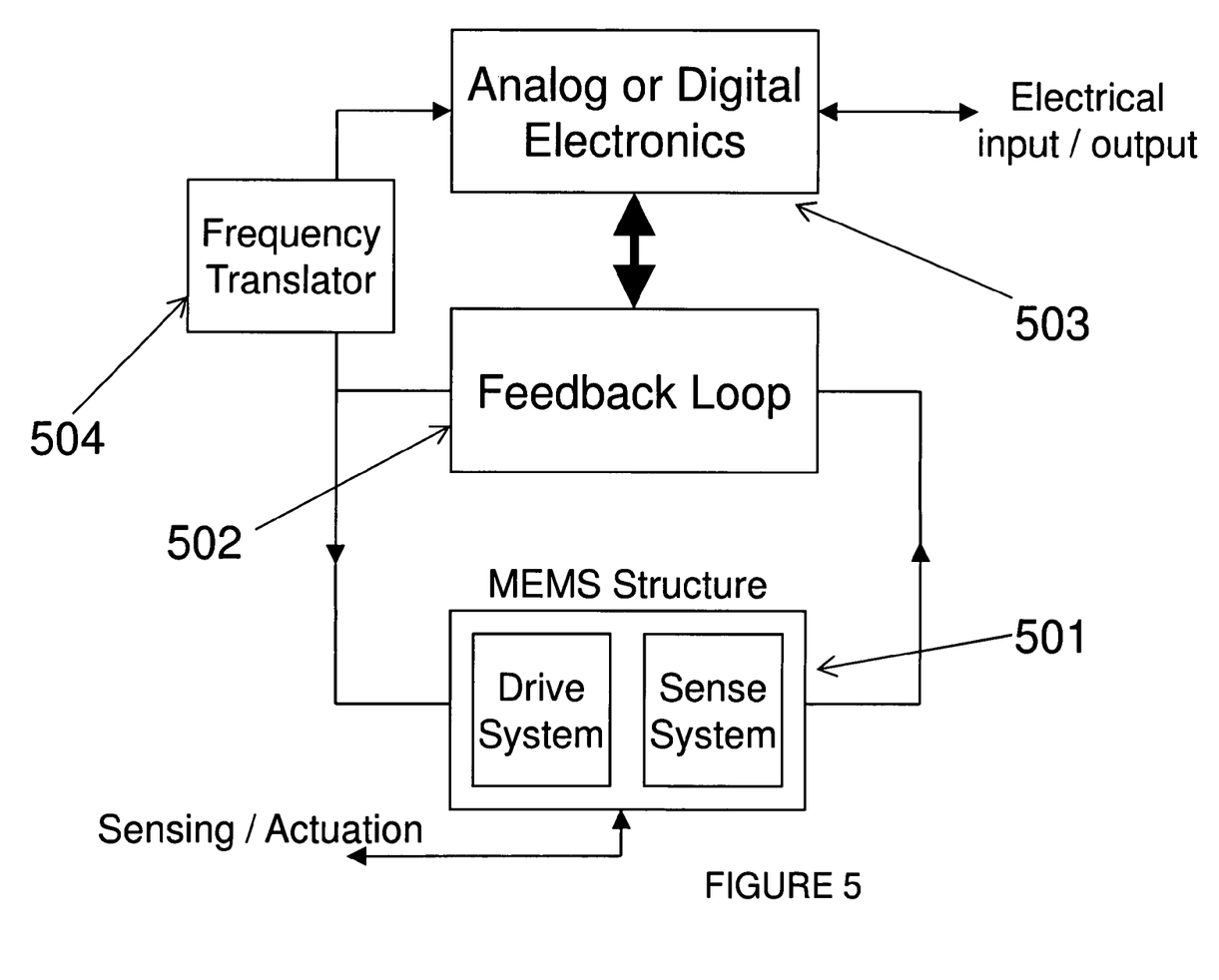
FIG. 5 is a diagram of a MEMS device where the clock to the support electronics is generated from the oscillatory micromechanical structure.

FIG. 5 shows the general idea in accordance with the present invention. The MEMS device 501 can be sensor or actuator whose primary objective is not to provide an accurate timing source. For example, vibratory gyroscopes have a resonating micromechanical structures but their primary function is to detect Coriolis force. The resonanting MEMS structure aside from actuating the proof masses also provide a very stable oscillation frequency. The output frequency after translated by a frequency translator 504 can be used to provide an accurate clock for the support of electronics.

Figure 6:
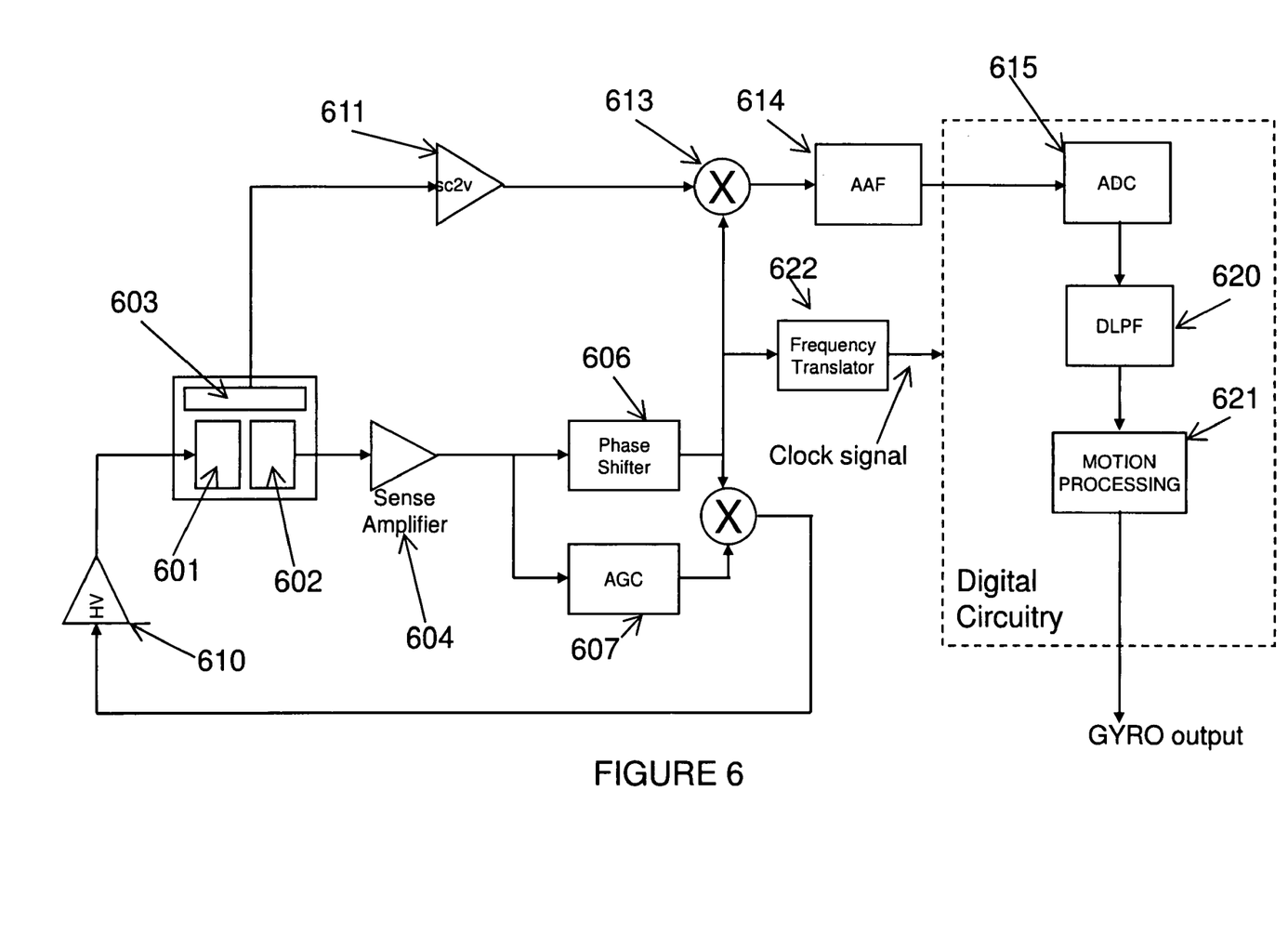
FIG. 6 is a diagram of a vibratory MEMS gyro where the clock signal for the digital electronics is provided by the resonating mechanical structure.

FIG. 6 shows a schematic drawing of a vibratory MEMS gyroscope structure. The MEMS gyroscope structure is composed three subsystems: drive system 601, sense system 602 and Coriolis sense system 603. The drive and sense system is put into oscillation through a loop that contains automatic gain control (AGC) 607, phase shifter 606, and amplifiers 604 and 610. The MEMS motion is detected by the sense system 602 and sense electronics 604. The amplitude of the MEMS oscillation is controlled by the AGC circuit 607. The phase shifter 606 adjusts the phase in the loop such that oscillation condition is met. Once the MEMS gyroscope structure is set into oscillation, the oscillation is very stable and the frequency shifts only fractional amounts with the temperatures. The angular rotation velocity is sensed by the Coriolis sense system 603 and the supporting electronics. In this system, Coriolis output is a sinusoidal signal whose output is determined by the rotational velocity. Sense amplifier 611 detects the Coriolis signal. After demodulator 613, this signal is converted to the base band. Anti-aliasing filter (AAF) 614 removes the high order frequency components on the Coriolis signal. The output of the AAF is an analog rate signal which can be converted to a digital signal by the integrated electronics. For this conversion an ADC 615 can be used. Digital low pass filter 620 and motion processor 621 further process the gyro output. The digital blocks shown in the FIG. 6 require an accurate clock for proper operation. This clock can be obtained from the oscillator loop as shown through a frequency translator 622.

In most of the MEMS devices, a typical MEMS resonant frequency is from 5 kHz to 50 kHz. Although this frequency is very stable, it is very low to be used in most of the digital circuitry. It needs to be multiplied to be in between 100 kHz to 1 GHz by using a frequency translator 622 as shown in FIG. 6.

Figure 7:
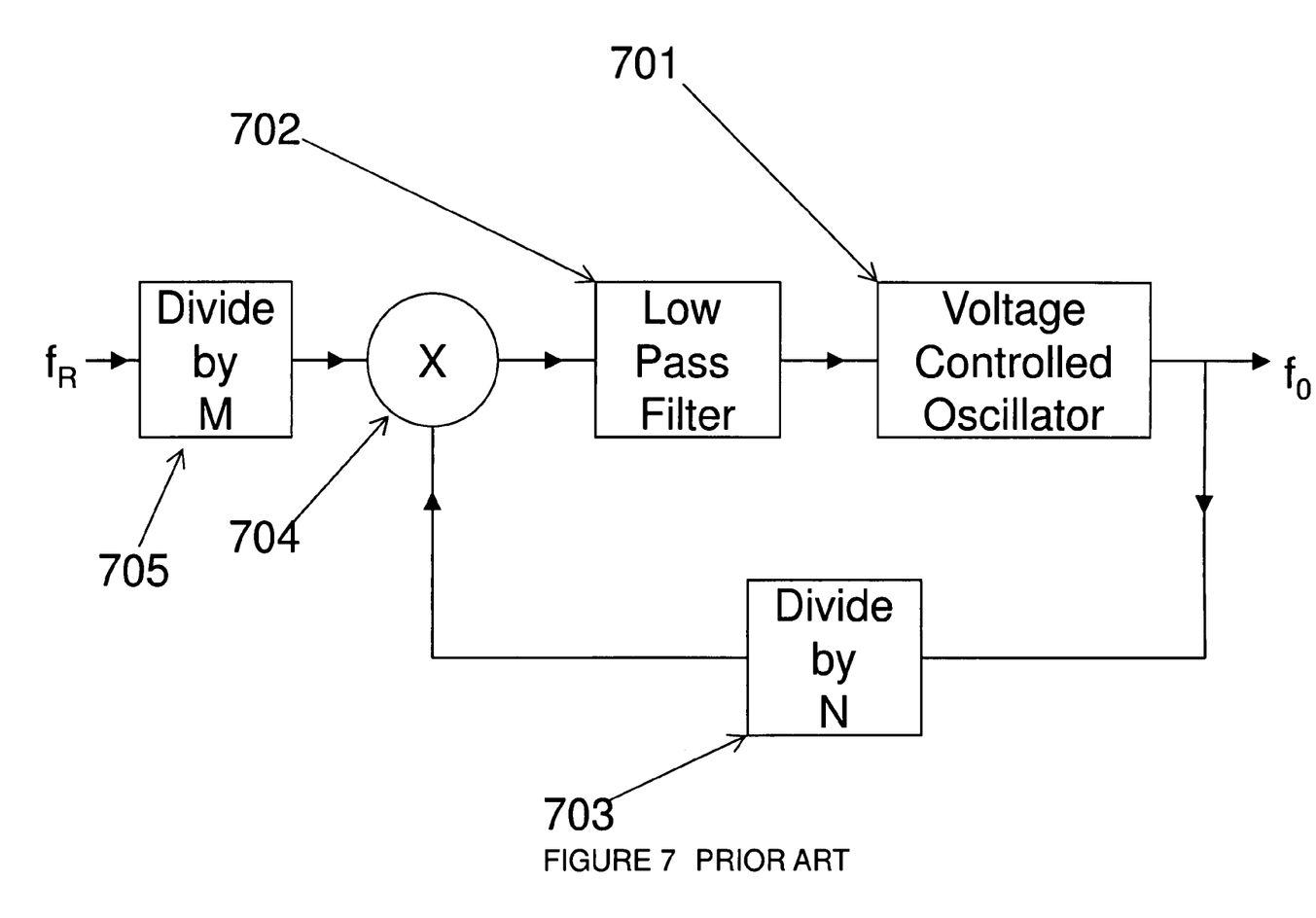
FIG. 7 is a diagram of a phase locked loop circuit.

One method of achieving the multiplication is to use a (prior art) PLL circuit as shown in FIG. 7. The circuit is composed of a multiplier 704, loop filter 702, voltage controlled oscillator (VCO) 701, and a divider 703. In this circuit, the reference signal which is generated by the MEMS oscillator is first divided by a divider 705 then it is multiplied by the VCO 701 output. The multiplication generates a DC component and high frequency components. The high frequency components are filtered out by the low pass filter 702. The filter output drives the input of a voltage controlled oscillator. The frequency of the VCO is divided by a programmable divider 703. The output of the PLL then is a multiplied version of the reference signal which is provided by the oscillating MEMS. Other examples of frequency translators that could be utilized to perform this function include but are not limited to delay locked loops, frequency multipliers or the like.

Figure 8:
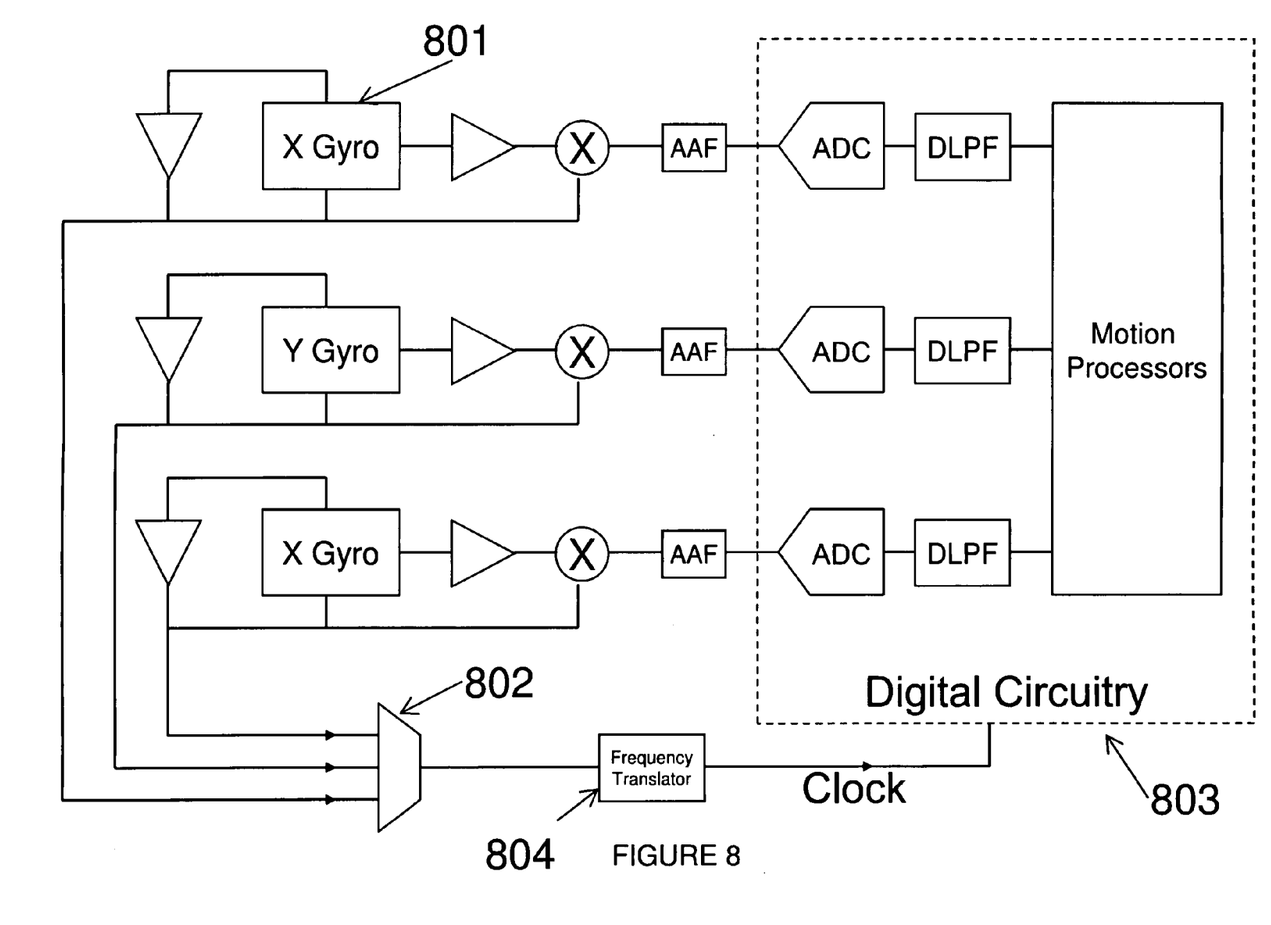
FIG. 8 is a diagram of a tri-axis MEMS gyroscope where the clock to the support electronics can be obtained from one of the axes.

FIG. 8 shows a block diagram of a tri-axis MEMS gyroscope. Each axis has its own oscillator loop which has been shown in details in FIG. 7. In this device, the clock to the digital circuitry can be taken from one of the axes through the multiplexer 802. Frequency translator 804, converts the gyro oscillation frequency to the frequencies suitable for the digital circuitry. This schema also enables synchronization of the gyro ADCs i.e. each axis is sampled at the same instance.

Figure 9:
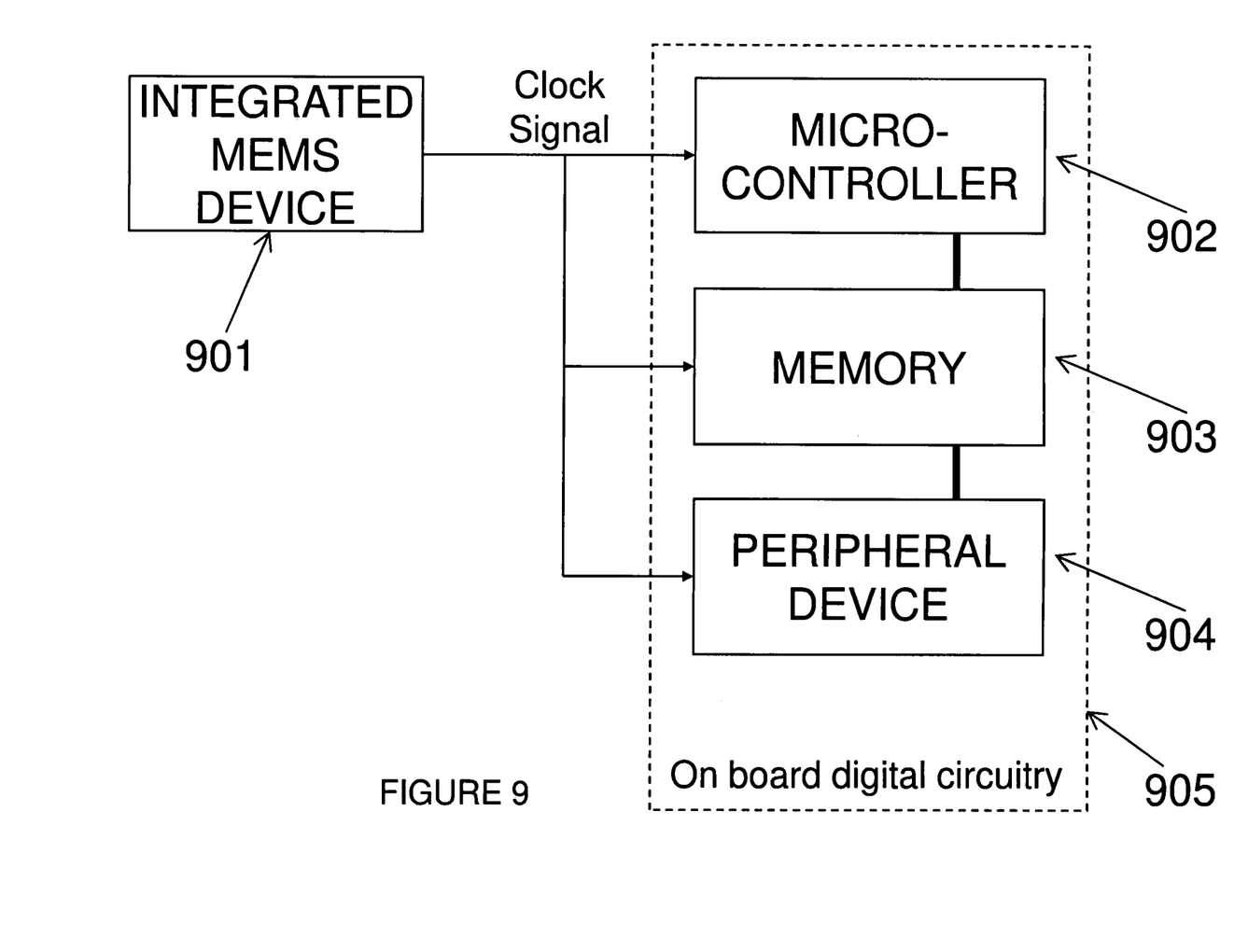
FIG. 9 is a diagram of a technique where a MEMS sensor provides clock for an external system

FIG. 9 shows a system where the clock signal is provided on-board the digital circuitry 905 from a MEMS device 901. The MEMS device 901 here can be one of the vibratory MEMS sensors or actuators. The clock generated by this device can be used to drive the on board digital circuitry 905. Accordingly, the driven circuitry can be on the same die (System On Chip), circuitry on a separate die in a common package (System In Package), or circuitry in separate packages on one or more printed circuit boards.

Another circuit where an accurate clock is needed is a radio transmitter. For this type of circuit the accuracy of the transmission frequency is important. This frequency can be generated from a vibrating MEMS device in accordance with an embodiment of the present invention.

In addition to generating the clock signal from the vibrating MEMS device, the temperature dependence of the clock can be further improved by means of temperature compensation techniques. Such temperature compensation techniques are described, for example, in U.S. Pat. No. 7,453,324, "Frequency and/or phase compensated microelectromechanical oscillator," assignee: Robert Bosch GmbH; U.S. Pat. No. 7,427,905, "Temperature controlled MEMS resonator and method for controlling resonator frequency," assignee: Robert Bosch GmbH; U.S. Pat. No. 7,362,197, "Temperature compensation for silicon MEMS resonator," assignee: Robert Bosch GmbH; U.S. Pat. No. 7,224,236, "Frequency and/or phase compensated microelectromechanical oscillator," assignee: Robert Bosch GmbH; and U.S. Pat. No. 7,202,761, "Temperature compensation for silicon MEMS resonator," assignee: Robert Bosch GmbH.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A vibratory gyroscope comprising:
   an oscillating MEMS structure responsive to angular velocity;
   a frequency translation circuit coupled to the oscillating MEMS structure; wherein the frequency of the oscillating MEMS structure is translated to provide a clock signal,
   digital circuit coupled to the frequency translation circuit and the oscillating MEMS structure, wherein the clock signal is utilized to drive the digital circuit and the digital circuit provides a digital output signal that is related to the angular velocity, wherein the digital circuit comprises an analog to digital converter (ADC);
   a sense amplifier coupled to the MEMS structure; and
   a demodulator coupled to the sense amplifier and to the ADC.

2. The vibratory gyroscope of claim 1 wherein the frequency of the clock signal is temperature compensated.

3. The vibratory gyroscope of claim 1 wherein the digital circuit is on the same die (System On Chip), is on separate die in a common package (System In Package), or is in separate packages on one or more printed circuit boards.

4. An accelerometer comprising:
   an oscillating MEMS structure responsive to acceleration;
   a frequency translation circuit coupled to the oscillating MEMS structure; wherein the frequency of the oscillating MEMS structure is translated to provide a clock signal,
   digital circuit coupled to the frequency translation circuit and the MEMS structure, wherein the clock signal is utilized to drive the digital circuit and the digital circuit provides a digital output signal that is related to the acceleration, wherein the digital circuit comprise an analog to digital converter (ADC);
   a sense amplifier coupled to the MEMS structure; and
   a demodulator coupled to the sense amplifier and to the ADC.

5. The accelerometer of claim 4 wherein the frequency of the clock signal is temperature compensated.

6. The accelerometer of claim 4, wherein the digital circuit is on the same die (System On Chip), is on separate die in a common package (System In Package), or is in separate packages on one or more printed circuit boards.

7. A motion sensor comprising:
   an oscillating MEMS structure responsive to an input motion;
   a frequency translation circuit coupled to the oscillating MEMS structure; wherein the frequency of the oscillating MEMS structure is translated to provide a clock signal,
   digital circuit coupled to the frequency translation circuit and the MEMS structure, wherein the clock signal is utilized to drive the digital circuit and the digital circuit provides a digital output signal that is related to the input motion, wherein the digital circuit comprises an analog to digital converter (ADC);
   a sense amplifier coupled to the MEMS structure; and
   a demodulator coupled to the sense amplifier and to the ADC.

8. The motion sensor of claim 7 wherein the clock is temperature compensated.

9. The motion sensor of claim 7 wherein the digital circuit is on the same die (System On Chip), is on separate die in a common package (System In Package), or is in separate packages on one or more printed circuit boards.

* * * * *